(12) United States Patent
Miyaoka

(10) Patent No.: US 10,515,171 B2
(45) Date of Patent: Dec. 24, 2019

(54) CIRCUIT DESCRIPTION GENERATION APPARATUS AND CIRCUIT DESCRIPTION GENERATION METHOD

(71) Applicants: KABUSHIKI KAISHA TOSHIBA, Minato-ku (JP); Toshiba Electronic Devices & Storage Corporation, Minato-ku (JP)

(72) Inventor: Yuichiro Miyaoka, Kawasaki (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/125,296

(22) Filed: Sep. 7, 2018

(65) Prior Publication Data

US 2019/0286778 A1   Sep. 19, 2019

(30) Foreign Application Priority Data

Mar. 16, 2018 (JP) .................................. 2018-048998

(51) Int. Cl.
*G06F 17/50* (2006.01)
*G11C 19/00* (2006.01)

(52) U.S. Cl.
CPC .......... *G06F 17/5045* (2013.01); *G11C 19/00* (2013.01)

(58) Field of Classification Search
CPC ............................ G06F 17/5045; G11C 19/00
USPC ........................................................ 716/102
See application file for complete search history.

(56) References Cited

U.S. PATENT DOCUMENTS

| 6,292,926 B1 | 9/2001 | Fukui et al. | |
| 7,126,381 B1* | 10/2006 | Schmit | H03K 19/17736 |
| | | | 326/101 |
| 7,149,996 B1* | 12/2006 | Lysaght | H04Q 3/54533 |
| | | | 326/38 |
| 7,318,213 B2 | 1/2008 | Nishi | |
| 2010/0058261 A1* | 3/2010 | Markov | G06F 17/5045 |
| | | | 716/106 |
| 2013/0135008 A1* | 5/2013 | Zhang | B82Y 10/00 |
| | | | 326/41 |

FOREIGN PATENT DOCUMENTS

| JP | 3177218 | 6/2001 |
| JP | 2007-323606 | 12/2007 |
| JP | 4580827 | 11/2010 |

* cited by examiner

*Primary Examiner* — Suresh Memula
(74) *Attorney, Agent, or Firm* — Oblon, McClelland, Maier & Neustadt, L.L.P.

(57) ABSTRACT

According to one embodiment, a circuit description generation apparatus includes: a reduction candidate extraction unit that generates a waveform of an input signal based on a verification vector, and extracts a candidate for reducing the number of stages of shift registers, based on a minimum value of the number of cycles that last until a change in a value of a signal represented by the waveform; and a reduction circuit generation unit that generates circuit information describing a circuit in which the reduction has been made, and verifies whether or not there is equivalence in output between a circuit before the reduction and a circuit after the reduction.

11 Claims, 5 Drawing Sheets

CIRCUIT DESCRIPTION GENERATION APPARATUS AND CIRCUIT DESCRIPTION GENERATION METHOD

CROSS-REFERENCE TO RELATED APPLICATIONS

This application is based upon and claims the benefit of priority from Japanese Patent Application No. 2018-048998, filed Mar. 16, 2018, the entire contents of which are incorporated herein by reference.

FIELD

Embodiments described herein relate generally to a circuit description generation apparatus and a circuit description generation method.

BACKGROUND

In the design of a semiconductor device, a pipeline circuit as a structure for operating a throughput of input and output with high efficiency can be found.

The pipeline circuit has a multiple-stage circuit structure of processing multiple operating circuits in parallel. Each of the circuits operating in parallel stores a computational result in an intermediate storage area called a pipeline register, and passes this computational result to a circuit in a subsequent stage, thereby implementing a high-performance operation.

Among the circuits having a multiple-stage circuit structure and operating in parallel, a value not used for computation in a circuit in a middle stage needs to be used in a circuit in a subsequent stage. Therefore, the same value not used for computation is copied to a pipeline register in one stage, or pipeline registers over multiple stages. Such a circuit structure in which the same value is copied to a register in one stage or registers over multiple stages, without change, is called a "shift register".

DETAILED DESCRIPTION

In general, according to one embodiment, there is provided a circuit description generation apparatus including a reduction candidate extraction unit configured to: extract, from circuit information describing a circuit to be designed that includes a shift register, a shift register group for each of multiple types of signals, the shift register group formed of multiple stages of shift registers to which a same signal is input; generate, based on a verification vector indicating a pattern of a value of an input signal to each of a plurality of shift register groups extracted, a waveform of an input signal to each of the plurality of shift register groups extracted; and extract, among the plurality of shift register groups, a shift register group as a candidate for reducing a number of stages of shift registers, based on a minimum value of a number of cycles within a predetermined period that last until a change in the value of an input signal represented by the waveform generated. In general, according to one embodiment, a circuit description generation apparatus includes a reduction circuit generation unit configured to: generate circuit information describing a circuit in which part of shift registers included in the shift register group extracted by the reduction candidate extraction unit has been eliminated, a number of stages of shift registers eliminated being based on the minimum value; verify whether or not there is equivalence between signal output from a circuit indicated by the circuit information generated and signal output from a circuit before the part of the shift registers is eliminated, the number of stages of shift registers eliminated being based on the minimum value; and when presence of the equivalence is verified, output, as modified circuit information, the circuit information describing a circuit in which the part of the shift registers has been eliminated, the number of stages of shift registers eliminated being based on the minimum value.

Hereinafter, embodiments will be described with reference to the drawings.

Figure 1:
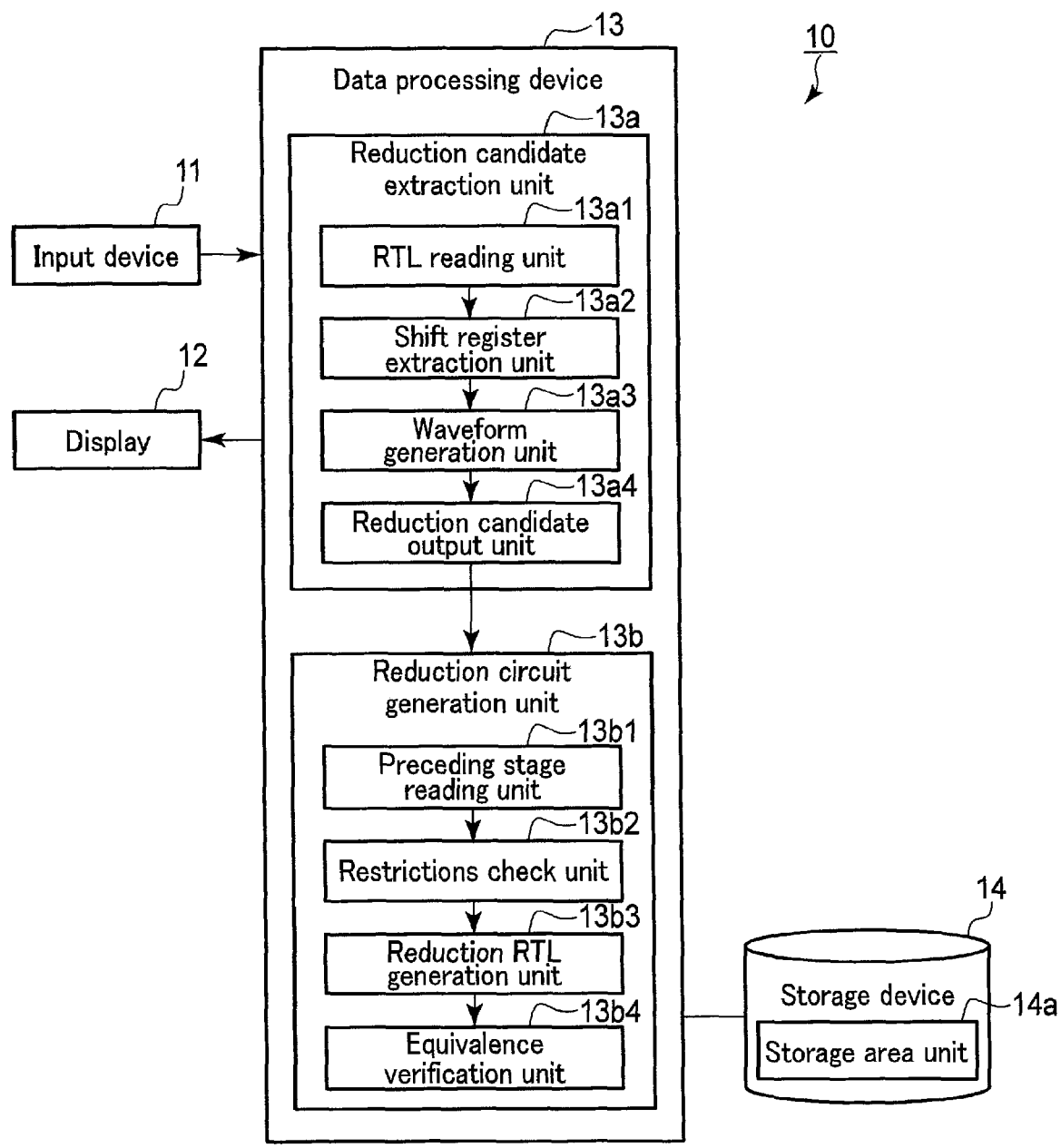
FIG. 1 is a block diagram showing a configuration of a circuit description generation apparatus according to the embodiment.

FIG. 1 is a block diagram showing a configuration of a circuit description generation apparatus according to the embodiment.

A circuit description generation apparatus 10 is, for example, a computer, and includes an input-output device, a storage device, a CPU (central processing unit), etc. The type of the CPU is not limited, so long as it is a processor.

Specifically, the circuit description generation apparatus 10 includes an input device 11 (such as a keyboard), a display 12 (such as a monitor) with a screen which, for example, displays various data, and a CPU. The circuit description generation apparatus 10 also includes a data processing device 13 for executing various types of processing, and a storage device 14 for storing various data.

The input device 11 receives an input operation, for example, an operation related to a description of a register transfer level (hereinafter, the register transfer level is referred to as "RTL", and the description thereof is referred to as "RTL description"), from a user as a circuit designer.

The storage device 14 can be realized by a non-volatile memory, etc. The storage device 14 includes a storage area unit 14a which stores a program in an RTL language describing a configuration of a semiconductor device to be designed, namely: the RTL description.

The data processing device 13 includes a reduction candidate extraction unit 13a and a reduction circuit generation unit (reduction circuit description generation unit) 13b.

The reduction candidate extraction unit 13a includes an RTL reading unit 13a1, a shift register extraction unit 13a2, a waveform generation unit 13a3, and a reduction candidate output unit 13a4.

The reduction circuit generation unit 13b includes a preceding stage reading unit 13b1, a restrictions check unit 13b2, a reduction RTL generation unit 13b3, and an equivalence verification unit 13b4. Each of the units in the data processing device 13 may be implemented mainly by the CPU executing a software (firmware), or by a hardware. For example, the CPU controls the processing performed by each of the units in the data processing device 13.

Each of the units of the reduction candidate extraction unit 13a will be described below.

The RTL reading unit 13a1 of the reduction candidate extraction unit 13a reads, from the storage area unit 14a of the storage device 14, the RTL description of a circuit of the semiconductor device to be designed.

For each of the multiple types of input signals, the shift register extraction unit 13a2 extracts, from the RTL description read by the RTL reading unit 13a1, a shift register group classified for each type of input signal (e.g. signal Sig_A, signal Sig_B, signal Sig_C). An individual shift register group is formed of multiple stages of shift registers to which the same input signal is input.

The waveform generation unit 13a3 reads, from the storage area unit 14a of the storage device 14, a verification vector indicating a pattern of a value of an input signal. Based on this verification vector, the waveform generation unit 13a3 generates a waveform of a value of an input signal to each of the shift register groups extracted by the shift register extraction unit 13a2.

The reduction candidate output unit 13a4 computes the number of cycles that last until the value of the input signal indicated by the waveform generated by the waveform generation unit 13a3 changes. The reduction candidate output unit 13a4 computes the minimum number of cycles within a predetermined time for each waveform corresponding to each shift register group.

Also, the reduction candidate output unit 13a4 analyzes, as a waveform pattern that may allow reduction of the number of registers, a waveform pattern excluding a waveform pattern in which the minimum number of cycles computed is one. The reduction candidate output unit 13a4 outputs, as reduction candidate information, information of a shift register group related to the aforementioned waveform pattern, together with the minimum number of cycles related to the waveform pattern. A shift register group as a reduction candidate means a configuration that may allow elimination of part of multiple stages of shift registers constituting the shift register group as a reduction candidate.

Next, each of the units of the reduction circuit generation unit 13b will be described below.

The preceding stage reading unit 13b1 of the reduction circuit generation unit 13b takes out one shift register group to be processed from the shift register groups indicated by the reduction candidate information output by the reduction candidate output unit 13a4 of the reduction candidate extraction unit 13a. The preceding stage reading unit 13b1 reads, from the storage area unit 14a of the storage device 14, an RTL description of a module connected to a preceding stage of the shift register group which has been taken out.

The restrictions check unit 13b2 sets the minimum number of cycles related to the shift register group—taken out by the preceding stage reading unit 13b1—to be a restriction condition of an input signal to the module represented by the RTL description read by the preceding stage reading unit 13b1 from the storage area unit 14a. Under this condition, the restrictions check unit 13b2 checks whether the above-described module, represented by the RTL description read by the preceding stage reading unit 13b1 from the storage area unit 14a, is properly operational or not.

When confirming that the module is not properly operational as a result of the checking, the restrictions check unit 13b2 reduces the aforementioned minimum number of cycles, a lower limit of which is two. Under this condition where the minimum number of cycles has been reduced, the restrictions check unit 13b2 checks again whether the above-described module represented by the RTL description read by the preceding stage reading unit 13b1 from the storage area unit 14a is properly operational or not.

The reduction RTL generation unit 13b3 generates a circuit in which the number of stages of shift registers in the shift register group, as a reduction candidate output by the reduction candidate output unit 13a4, has been reduced according to the minimum number of cycles under the condition where the restrictions check unit 13b2 has confirmed a proper operation of the module represented by the RTL description, read by the preceding stage reading unit 13b1 from the storage area unit 14a.

The equivalence verification unit 13b4 verifies whether or not there is equivalence between signal output from a circuit after the reduction by the reduction RTL generation unit 13b3 and signal output from a circuit before the reduction.

Figure 2:
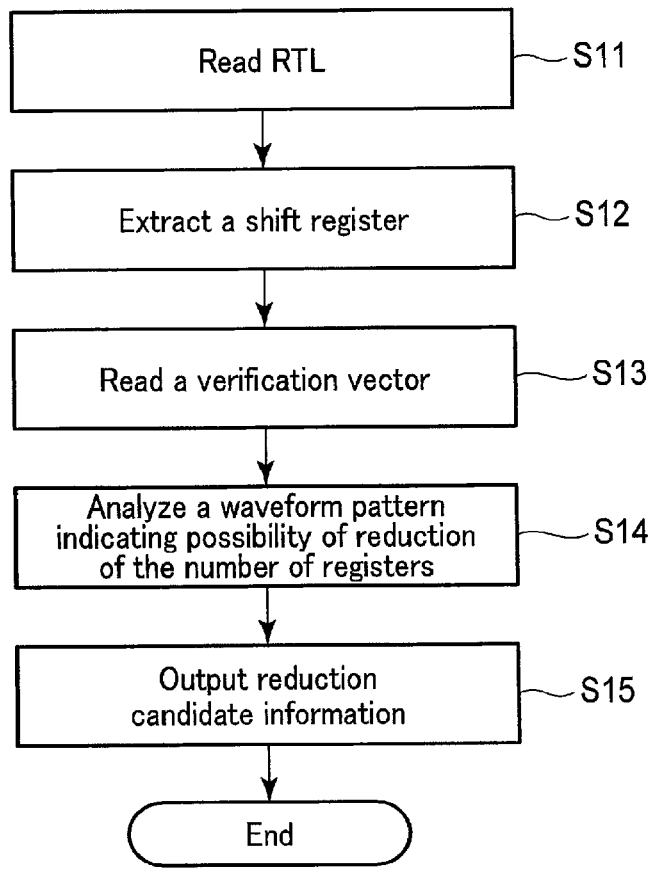
FIG. 2 is a flowchart showing an example of the processing operation of the reduction candidate extraction unit of the circuit description generation apparatus according to the embodiment.

FIG. 2 is a flowchart showing an example of the processing operation of the reduction candidate extraction unit of the circuit description generation apparatus according to the embodiment.

First, the RTL reading unit 13a1 of the reduction candidate extraction unit 13a reads, from the storage area unit 14a of the storage device 14, an RTL description of a circuit of a semiconductor device to be designed (S11).

The shift register extraction unit 13a2 extracts, from the RTL description read by the RTL reading unit 13a1, a shift register group for each type of input signal (S12).

Figure 3:
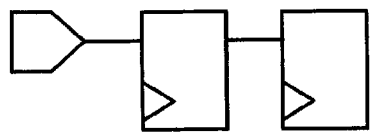
FIG. 3 is a diagram respectively showing an example of the shift register extracted by the reduction candidate extraction unit of the circuit description generation apparatus according to the embodiment.
Figure 4:
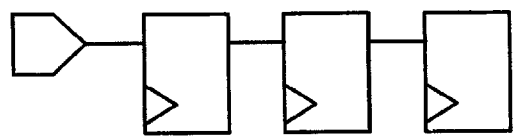
FIG. 4 is a diagram respectively showing an example of the shift register extracted by the reduction candidate extraction unit of the circuit description generation apparatus according to the embodiment.
Figure 5:
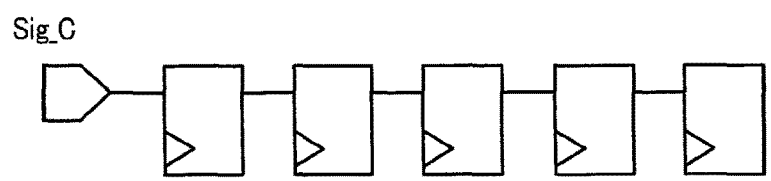
FIG. 5 is a diagram respectively showing an example of the shift register extracted by the reduction candidate extraction unit of the circuit description generation apparatus according to the embodiment.

FIGS. 3 to 5 are diagrams respectively showing an example of the shift register extracted by the reduction candidate extraction unit of the circuit description generation apparatus according to the embodiment.

For example, the shift register extraction unit 13a2 can extract a first shift register group shown in FIG. 3, which is a shift register group for inputting a signal Sig_A; a second shift register group shown in FIG. 4, which is a shift register group for inputting a signal Sig_B; and a third shift register group shown in FIG. 5, which is a shift register group for inputting a signal Sig_C.

The first shift register group shown in FIG. 3 is formed of two stages of shift registers (two shift registers) that are connected in series. The second shift register group shown in FIG. 4 is formed of three stages of shift registers (three shift registers) that are connected in series. The third shift register group shown in FIG. 5 is formed of five stages of shift registers (five shift registers) that are connected in series.

The waveform generation unit 13a3 reads, from the storage area unit 14a of the storage device 14, a verification vector indicating a pattern of a value of an input signal (S13). Based on this verification vector, the waveform generation unit 13a3 generates a waveform of a value of an input signal to each of the shift register groups for each type of input signal extracted by the shift register extraction unit 13a2.

Figure 6:
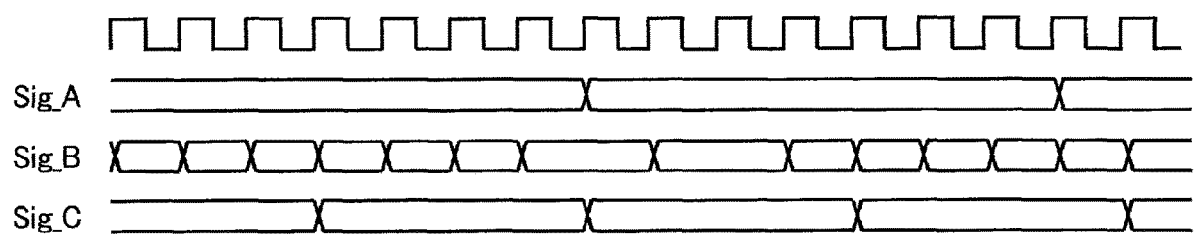
FIG. 6 is a diagram showing an example of the waveform of a value of an input signal generated by the reduction candidate extraction unit of the circuit description generation apparatus, according to the embodiment.

FIG. 6 is a diagram showing an example of the waveform of a value of an input signal generated by the reduction candidate extraction unit of the circuit description generation apparatus, according to the embodiment.

As shown in FIG. 6, the waveform generation unit 13a3, for example, can generate a waveform of a value of an input signal to the first shift register group shown in FIG. 3 that is synchronized with a clock signal; a waveform of a value of an input signal to the second shift register group shown in FIG. 4 that is synchronized with a clock signal; and a waveform of a value of an input signal to the third shift register group shown in FIG. 5 that is synchronized with a clock signal.

The reduction candidate output unit 13a4 computes the number of cycles that last until the value of the input signal indicated by the waveform generated by the waveform generation unit 13a3 changes. Based on the number of cycles computed, the reduction candidate output unit 13a4 computes the minimum number of cycles within a predetermined time for each waveform corresponding to each shift register group.

For example, the reduction candidate output unit 13a4 can compute the minimum number of cycles as "7" for the waveform of the value of the input signal to the first shift register group shown in FIG. 6. Likewise, the reduction candidate output unit 13a4 can compute the minimum number of cycles as "1" for the waveform of the value of the input signal to the second shift register group shown in FIG. 6. Likewise, the reduction candidate output unit 13a4 can compute the minimum number of cycles as "4" for the waveform of the value of the input signal to the third shift register group shown in FIG. 6.

Also, the reduction candidate output unit 13a4 analyzes, as a waveform pattern that may allow reduction of the number of stages of registers, a waveform pattern excluding a waveform pattern in which the minimum number of cycles computed is one (S14). The reduction candidate output unit 13a4 outputs, as reduction candidate information, information of a shift register group related to this waveform pattern, together with the minimum number of cycles related to the waveform pattern (S15).

For example, the reduction candidate output unit 13a4 selects, among the waveform patterns shown in FIG. 6, the waveform patterns excluding the waveform pattern of the value of the input signal to the second shift register group, in which the minimum number of cycles is "1." The selected waveforms are the waveform pattern of the value of the input signal to the first shift register group and the waveform pattern of the value of the input signal to the third shift register group.

The reduction candidate output unit 13a4 outputs, as first reduction candidate information, information of the first shift register group shown in FIG. 3, and the minimum number "7" of cycles related to the waveform pattern generated for this shift register group. The reduction candidate output unit 13a4 also outputs, as second reduction candidate information, information of the third shift register group shown in FIG. 5, and the minimum number "4" of cycles related to the waveform pattern generated for this shift register group.

Figure 7:
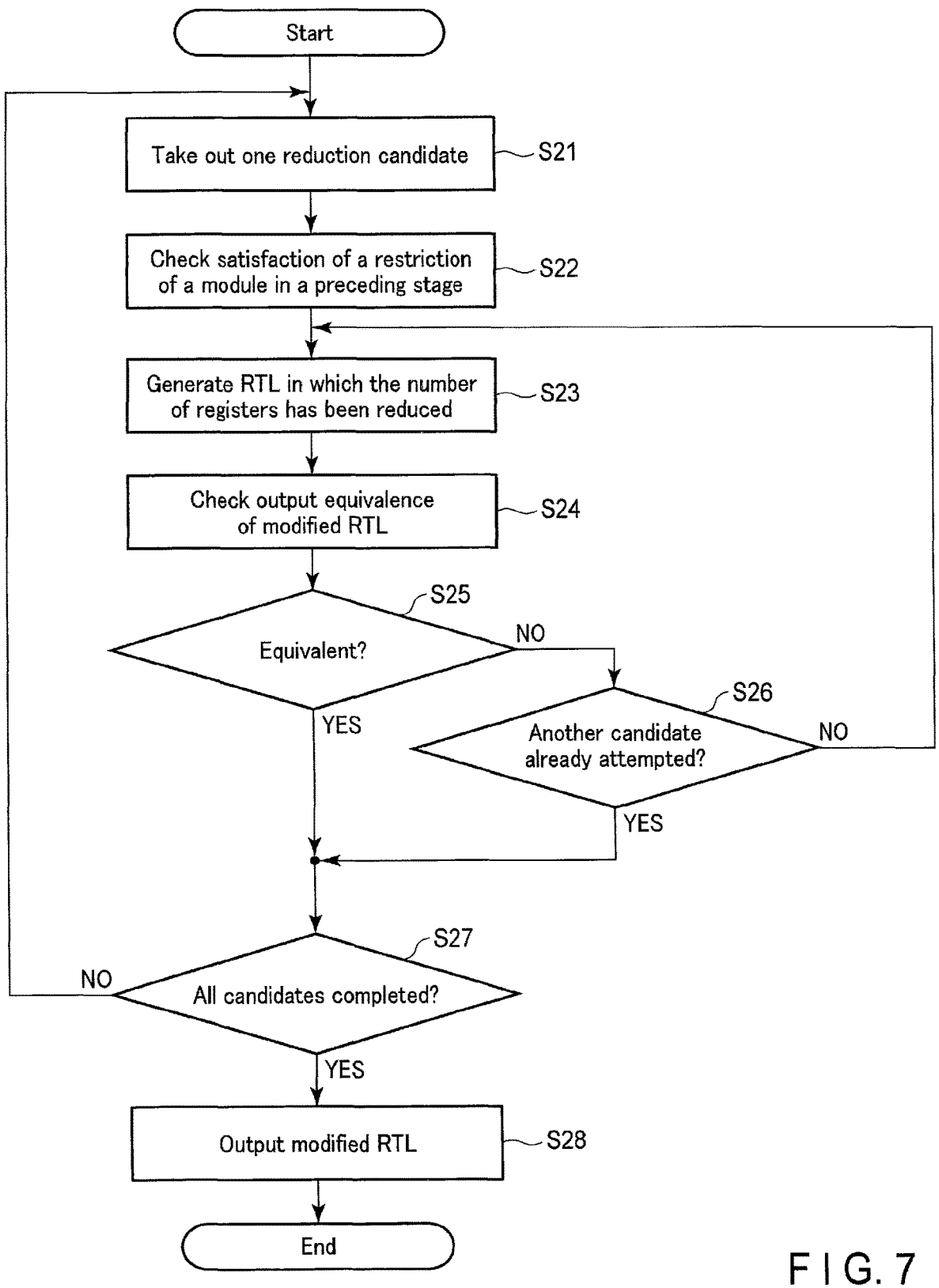
FIG. 7 is a flowchart showing an example of the processing operation of the reduction circuit generation unit of the circuit description generation apparatus according to the embodiment.

FIG. 7 is a flowchart showing an example of the processing operation of the reduction circuit generation unit of the circuit description generation apparatus according to the embodiment.

First, the preceding stage reading unit 13b1 of the reduction circuit generation unit 13b takes out one shift register group to be processed from the shift register groups indicated by the reduction candidate information output by the reduction candidate output unit 13a4 of the reduction candidate extraction unit 13a. The preceding stage reading unit 13b1 reads, from the storage area unit 14a of the storage device 14, an RTL description of a module connected to a preceding stage of the shift register group taken out (S21).

The restrictions check unit 13b2 sets the minimum number of cycles related to the shift register group taken out by the preceding stage reading unit 13b1 to be a restriction condition of an input signal to the module represented by the RTL description read by the preceding stage reading unit 13b1 from the storage area unit 14a. Under this condition, the restrictions check unit 13b2 checks whether the above-described module represented by the RTL description read by the preceding stage reading unit 13b1 from the storage area unit 14a is properly operational or not (S22).

When confirming that the module does not properly operate as a result of the checking, the restrictions check unit 13b2 reduces the aforementioned minimum number of cycles, a lower limit of which is two. Under this condition where the minimum number of cycles has been reduced, the restrictions check unit 13b2 checks again whether the above-described module represented by the RTL description read by the preceding stage reading unit 13b1 from the storage area unit 14a is properly operational or not.

For example, if a shift register group to be processed is the third shift register group shown in FIG. 5, the minimum number of cycles is four. Initially, the restrictions check unit 13b2 checks whether a module in a preceding stage (the RTL description being, for example, "Sig_C!=$past(Sig_C) |=>$stable(Sig_C)") becomes properly operational or not based on this minimum number 4 as a restriction condition. When confirming that the module does not properly operate as a result of the checking, the restrictions check unit 13b2 reduces the aforementioned minimum number of cycles to three. Under this condition where the minimum number of cycles has been reduced, the restrictions check unit 13b2 checks again whether the module in the preceding stage is properly operational or not. Thereafter, the processing is repeated until it can be confirmed that the module in the preceding stage is properly operational.

If it has been confirmed that the module in the preceding stage is properly operational, the reduction RTL generation unit 13b3 generates a modified RTL description representing a circuit in which the reduction has been attempted, according to the minimum number of cycles under the condition where the restrictions check unit 13b2 has confirmed the proper operation of the module represented by the RTL description read by the preceding stage reading unit 13b1 from the storage area unit 14a (S23). The modified RTL description is an RTL description representing a circuit in which the number of stages of shift registers in the shift register group, as a reduction candidate output by the reduction candidate output unit 13a4, has been reduced.

For example, if a shift register group to be processed is the third shift register group shown in FIG. 5, and if the minimum number of cycles under the condition where the restrictions check unit 13b2 has confirmed the proper operation is four, the reduction RTL generation unit 13b3 deems it possible to replace four stages of shift registers shown in FIG. 5 by one stage of shift register. The reduction RTL generation unit 13b3 computes the number three by subtracting one (the number of stages after the replacement) from the aforementioned number of stages, which is four (the number of stages before the replacement), as the number of stages of shift registers that can be reduced. In accordance with the result of this computation, the reduction RTL generation unit 13b3 generates an RTL description representing a circuit in which three stages of shift registers in the third shift register group shown in FIG. 5 have been eliminated.

The equivalence verification unit 13b4 verifies whether or not there is equivalence between signal output from a circuit after the reduction by the reduction RTL generation unit 13b3 and signal output from a circuit before the reduction (S24).

Figure 8:
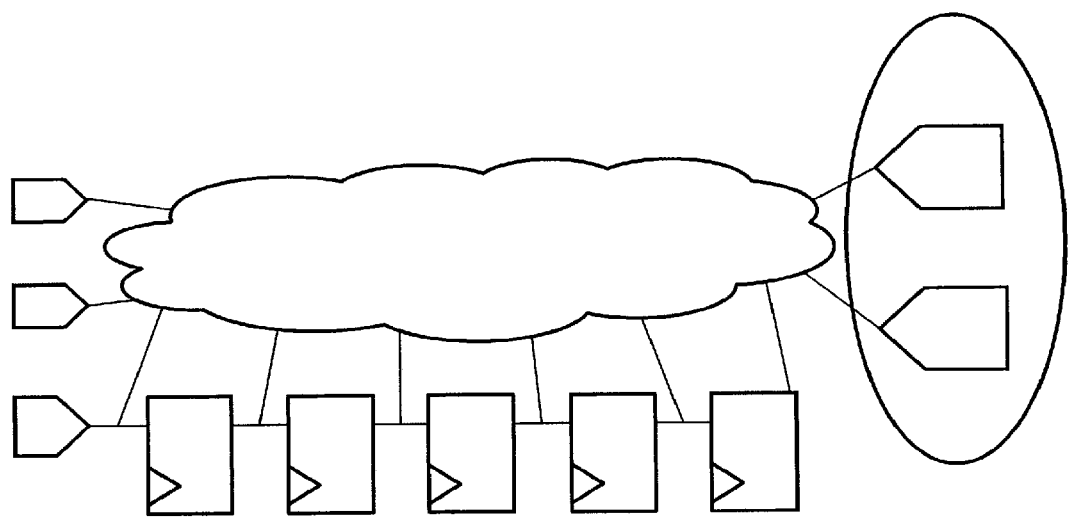
FIG. 8 is a diagram showing an example of the circuit before the reduction by the reduction circuit generation unit of the circuit description generation apparatus according to the embodiment.
Figure 9:
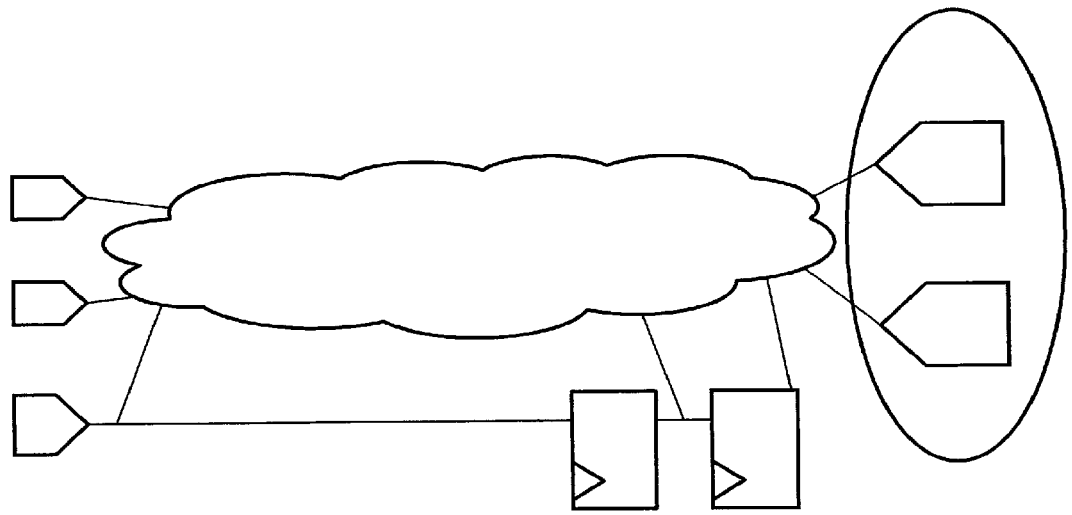
FIG. 9 is a diagram showing an example of the circuit after the reduction by the reduction circuit generation unit of the circuit description generation apparatus according to the embodiment.

FIG. 8 is a diagram showing an example of the circuit before the reduction by the reduction circuit generation unit of the circuit description generation apparatus according to the embodiment. FIG. 9 is a diagram showing an example of the circuit after the reduction by the reduction circuit generation unit of the circuit description generation apparatus according to the embodiment.

For example, when the circuit before the reduction is a circuit including the third shift register group shown in FIG. 5, the number of stages of shift registers included in the third shift register group is five in the circuit before the reduction, as shown in FIG. 8. On the other hand, when three stages of shift registers in the third shift register group are eliminated, as described above, the number of stages of shift registers included in the shift register group is two in the circuit after the reduction, as shown in FIG. 9.

If, as a result of S24, there is no equivalence between the output from the circuit before the reduction and the output from the circuit after the reduction (S25, NO), and if there is another candidate for the number of stages of shift registers to be reduced (in other words, if there is a candidate for a circuit in which the number of stages to be reduced has been decreased, namely, a candidate for a circuit in which the number of stages of shift registers in the shift register group after the reduction has been increased—the candidate used for verifying again whether or not there is equivalence) (S26, NO), the step returns to S23. Then, in S24, the equivalence verification unit 13b4 verifies, based on the circuit in which the number of stages to be reduced has been decreased as a circuit after a new reduction, whether or not there is equivalence between signal output from the circuit before the reduction and signal output from the circuit after the new reduction.

For example, if a circuit after an initial reduction is a circuit in which three stages of shift registers have been eliminated from the configuration shown in FIG. 5, as described above and as shown in FIG. 9, and if this circuit has no equivalence with a circuit before the reduction, the equivalence verification unit 13b4 determines, as a circuit after a new reduction, a circuit in which two stages of shift registers or one stage of shift register have/has been eliminated from the configuration shown in FIG. 5. Then, the equivalence verification unit 13b4 can verify whether or not there is equivalence between signal output from the circuit after the new reduction and signal output from the circuit before the reduction.

In a case of determining "YES" in S25 or S26, and if there is one or more shift register groups that have not been taken out in S21 to be subjected to the processing of the equivalence check, among the shift register groups as reduction candidates output by the reduction candidate output unit 13a4 of the reduction candidate extraction unit 13a in S15, (S27, NO), the step returns to S21, and the preceding stage reading unit 13b1 takes out one shift register group to be processed from among the shift register groups that have not been taken out. Then, the same processing as S21 and the subsequent steps are performed.

Also, in the case of determining "YES" in S25 or S26, and if presence or absence of the equivalence has already been checked for all the shift register groups as reduction candidates output by the reduction candidate output unit 13a4 of the reduction candidate extraction unit 13a in S15 (S27, YES), the reduction circuit generation unit 13b outputs the modified RTL as a new RTL (S28), and the processing ends.

As described above, the circuit description generation apparatus according to the embodiment outputs a shift register group as a reduction candidate based on the RTL description describing the circuit configuration and the verification vector; attempts to reduce the number of shift registers in the shift register group as a reduction candidate; and checks the equivalence between the circuit before the reduction and the circuit after the reduction, to thereby determine the modified RTL description. Therefore, it is possible to properly eliminate a shift register in a circuit to be designed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A circuit description generation apparatus comprising:
    a reduction candidate extraction unit configured to:
        extract, from circuit information describing a circuit to be designed that includes a shift register, a shift register group for each of multiple types of signals, the shift register group formed of multiple stages of shift registers to which a same signal is input;
        generate, based on a verification vector indicating a pattern of a value of an input signal to each of a plurality of shift register groups extracted, a waveform of an input signal to each of the plurality of shift register groups extracted; and
        extract, among the plurality of shift register groups, a shift register group as a candidate for reducing a number of stages of shift registers, based on a minimum value of a number of cycles within a predetermined period that last until a change in the value of an input signal represented by the waveform generated; and
    a reduction circuit generation unit configured to:
        generate circuit information describing a circuit in which part of shift registers included in the shift register group extracted by the reduction candidate extraction unit has been eliminated, a number of stages of shift registers eliminated being based on the minimum value;

verify whether or not there is equivalence between signal output from a circuit indicated by the circuit information generated and signal output from a circuit before the part of the shift registers is eliminated, the number of stages of shift registers eliminated being based on the minimum value; and when presence of the equivalence is verified, output, as modified circuit information, the circuit information describing a circuit in which the part of the shift registers has been eliminated, the number of stages of shift registers eliminated being based on the minimum value.

2. The circuit description generation apparatus according to claim 1, wherein the reduction circuit generation unit is configured to:

extract, from the circuit information describing the circuit to be designed, a circuit in a preceding stage in the shift register group extracted by the reduction candidate extraction unit;

check whether the circuit in the preceding stage is properly operational or otherwise under a condition in which a number of cycles that last until a change in a value of an input signal to the circuit in the preceding stage is the minimum value; and when a proper operation of the circuit in the preceding stage is confirmed, generate the circuit information describing a circuit in which the part of the shift registers included in the shift register group extracted by the reduction candidate extraction unit has been eliminated, the number of stages of shift registers eliminated being based on the minimum value.

3. The circuit description generation apparatus according to claim 1, wherein the reduction circuit generation unit is configured to:

when absence of the equivalence is confirmed, generate circuit information describing a circuit in which the part of the shift registers included in the shift register group extracted by the reduction candidate extraction unit has been eliminated, the number of stages of shift registers eliminated being less than the number of stages based on the minimum value; and verify presence or absence of the equivalence between the signal output from the circuit indicated by the circuit information generated and the signal output from the circuit before the part of the shift registers is eliminated, the number of stages of shift registers eliminated being based on the minimum value.

4. The circuit description generation apparatus according to claim 1, wherein the reduction candidate extraction unit is configured to extract, among the plurality of shift register groups extracted, a shift register group as a candidate shift register group for reducing the number of shift registers, excluding a shift register group in which the minimum value of the number of cycles that last until a change in a value of an input signal represented by the waveform generated is one.

5. The circuit description generation apparatus according to claim 2, wherein the reduction circuit generation unit is configured to:

when absence of the equivalence is confirmed, generate circuit information describing a circuit in which the part of the shift registers included in the shift register group extracted by the reduction candidate extraction unit has been eliminated, the number of stages of shift registers eliminated being less than the number of stages based on the minimum value; and verify whether or not there is equivalence between signal output from a circuit indicated by the circuit information generated and signal output from a circuit before the part of the shift registers is eliminated, the number of stages of shift registers eliminated being based on the minimum value.

6. The circuit description generation apparatus according to claim 2, wherein the reduction candidate extraction unit is configured to extract, among the plurality of shift register groups extracted, a shift register group as a candidate shift register group for reducing the number of shift registers, excluding a shift register group in which the minimum value of the number of cycles that last until a change in a value of an input signal represented by the waveform generated is one.

7. The circuit description generation apparatus according to claim 3, wherein the reduction candidate extraction unit is configured to extract, among the plurality of shift register groups extracted, a shift register group as a candidate shift register group for reducing the number of shift registers, excluding a shift register group in which the minimum value of the number of cycles that last until a change in a value of an input signal represented by the waveform generated is one.

8. A circuit description generation method implemented by a computer, the method comprising:

extracting, from circuit information describing a circuit to be designed that includes a shift register, a shift register group for each of multiple types of signals, the shift register group formed of multiple stages of shift registers to which a same signal is input;

generating, based on a verification vector indicating a pattern of a value of an input signal to each of a plurality of shift register groups extracted, a waveform of an input signal to each of the plurality of shift register groups extracted;

extracting, among the plurality of shift register groups, a shift register group as a candidate for reducing a number of stages of shift registers, based on a minimum value of a number of cycles within a predetermined period that last until a change in a value of an input signal represented by the waveform generated;

generating circuit information describing a circuit in which part of shift registers included in the shift register group extracted has been eliminated, a number of stages of shift registers eliminated being based on the minimum value;

verifying whether or not there is equivalence between signal output from a circuit indicated by the circuit information generated and signal output from a circuit before the part of the shift registers is eliminated, the number of stages of shift registers eliminated being based on the minimum value; and when presence of the equivalence is verified, outputting, as modified circuit information, the circuit information describing a circuit in which the part of the shift registers has been eliminated, the number of stages of shift registers eliminated being based on the minimum value.

9. The circuit description generation method according to claim 8, comprising:

extracting, from the circuit information describing the circuit to be designed, a circuit in a preceding stage in the shift register group extracted;

checking whether the circuit in the preceding stage is properly operational or otherwise under a condition in which a number of cycles that last until a change in a value of an input signal to the circuit in the preceding stage is the minimum value; and when a proper operation of the circuit in the preceding stage is confirmed, generating the circuit information describing a circuit in which the part of the shift registers included in the shift register group extracted has been eliminated, the number of stages of shift registers eliminated being based on the minimum value.

10. The circuit description generation method according to claim 8, comprising:

when absence of the equivalence is confirmed, generating circuit information describing a circuit in which the part of the shift registers included in the shift register group extracted has been eliminated, the number of stages of shift registers eliminated being less than the number of stages based on the minimum value; and verifying presence or absence of the equivalence between the signal output from the circuit indicated by the circuit information generated and the signal output from the circuit before the part of the shift registers is eliminated, the number of stages of shift registers eliminated being based on the minimum value.

11. The circuit description generation method according to claim 8, comprising extracting, among the plurality of shift register groups extracted, a shift register group as a candidate shift register group for reducing the number of shift registers, excluding a shift register group in which the minimum value of the number of cycles that last until a change in a value of an input signal represented by the waveform generated is one.

* * * * *